United States Patent [19]
Beat

[11] Patent Number: 5,687,352
[45] Date of Patent: Nov. 11, 1997

[54] MEMORY DEVICE CONTROLLED BY CONTROL SIGNALS IN THE FORM OF GRAY CODE

[75] Inventor: Robert Beat, Bristol, United Kingdom

[73] Assignee: SGS-Thomson Microelectronics Limited, Bristol, United Kingdom

[21] Appl. No.: 519,169

[22] Filed: Aug. 25, 1995

[30] Foreign Application Priority Data

Aug. 26, 1994 [GB] United Kingdom ............... 9417271

[51] Int. Cl.⁶ ................................................. G06F 13/00
[52] U.S. Cl. ................... 395/481; 395/427; 395/430; 364/DIG. 1
[58] Field of Search ............................. 395/427, 430, 395/481

[56] References Cited

U.S. PATENT DOCUMENTS

| | | | |
|---|---|---|---|
| 4,579,433 | 4/1986 | Ishizaka et al. | 354/21 |
| 4,958,182 | 9/1990 | Froberg et al. | 354/412 |
| 5,115,413 | 5/1992 | Sato et al. | 365/230 |
| 5,181,231 | 1/1993 | Parikh et al. | 377/26 |
| 5,245,572 | 9/1993 | Kosonocky et al. | 365/189 |
| 5,315,619 | 5/1994 | Bhatt | 375/94 |
| 5,333,119 | 7/1994 | Raatz et al. | 364/760 |
| 5,386,533 | 1/1995 | Morris | 395/425 |

FOREIGN PATENT DOCUMENTS

| | | | |
|---|---|---|---|
| 0 281 867 | 9/1988 | European Pat. Off. | G11C 5/02 |
| 0 416 714 | 3/1991 | European Pat. Off. | G11C 8/00 |

OTHER PUBLICATIONS

Mehrotra et al., "Serial 9Mb Flash EEPROM for Solid State Disk Applications", *1992 Symposium on VLSI Circuits Digest of Technical Papers*, pp. 24–25, 1992.

Tah–Kang et al., "A 50ns CMOS 256K EEPROM", *IEEE Journal of Solid–State Circuits*, vol. 23, No. 5, pp. 1164–1170, 1988.

*Primary Examiner*—Frank J. Asta
*Attorney, Agent, or Firm*—David V. Carlson; Seed and Berry LLP

[57] ABSTRACT

A memory device has a data storage portion and at least peripheral circuit connected to the data storage portion for carrying out a function with respect to the data storage portion. The memory device also has control circuitry connected to the at least one peripheral circuit and operable to provide a plurality of consecutive signals for controlling the function of said at least one peripheral circuit. The consecutive signals generated by the control circuitry are in the form of Gray code.

23 Claims, 9 Drawing Sheets

| | Selected Cell | | | Unselected Cell Same Row | | | Unselected Cell Same Column | | |
|---|---|---|---|---|---|---|---|---|---|
| | Drain Voltage | Gate Voltage | Source Voltage | Drain Voltage | Gate Voltage | Source Voltage | Drain Voltage | Gate Voltage | Source Voltage |
| PROGRAM | ~5V | $V_{PP}$ | $V_{GND}$ | $V_{GND}$ | $V_{PP}$ | $V_{GND}$ | ~5V | $V_{GND}$ | $V_{GND}$ |
| ERASE* | FLOATING | $V_{GND}$ | $V_{PP}$ | FLOATING | $V_{GND}$ | $V_{PP}$ | FLOATING | $V_{GND}$ | $V_{PP}$ |
| READ | BIASED TO ~1V | ~5V | $V_{GND}$ | $V_{GND}$ | ~5V | $V_{GND}$ | BIASED TO ~1V | $V_{GND}$ | $V_{GND}$ |

\* ALL CELLS SELECTED IN ERASE

FIG. 6(II)

FIG. 7
PROGRAM ALGORITHM

FIG. 8a

'FAN IN' LIMITATION, 5 STATES TO 1,
NOT NORMALLY POSSIBLE WITH A 4 BIT CODE

FIG. 8b

'FAN IN' LIMITATION, SOLUTION USING DUMMY STATE

MEMORY DEVICE CONTROLLED BY CONTROL SIGNALS IN THE FORM OF GRAY CODE

TECHNICAL FIELD

The present invention relates to a memory device and to a method for controlling such a device and in particular but not exclusively to a flash EPROM.

BACKGROUND OF THE INVENTION

In memory devices, control circuitry is used to interpret user commands and activate relevant peripheral circuits to perform, in respect of the memory, the user commands. Usually a single user command requires a defined sequence of events to be performed. The control circuitry thus acts as a state machine to provide a coded signal for each stage of the sequence of events, the state machine providing a set of states and a set of transition rules for moving between those states at clock edges.

In order to activate the relevant peripheral circuits, the control circuitry sends the coded signals to these circuits. The control circuitry may provide signals that control each state individually and in this situation separate signal paths would be provided between each peripheral circuit and the control circuitry. However, this is disadvantageous in that a relatively large number of outputs from the control circuitry is required and the signal routing is complex.

To avoid these difficulties, it has been proposed to provide bus signals routed throughout the memory device. Each peripheral device is then provided with a decoder which activates the respective peripheral circuit when a valid signal from the bus is decoded. This may reduce the number of output signals from the control circuitry. However, the bus needs to be routed throughout the circuitry to reach all the circuits to be controlled and there are usually a large number of circuits.

Figure 1:
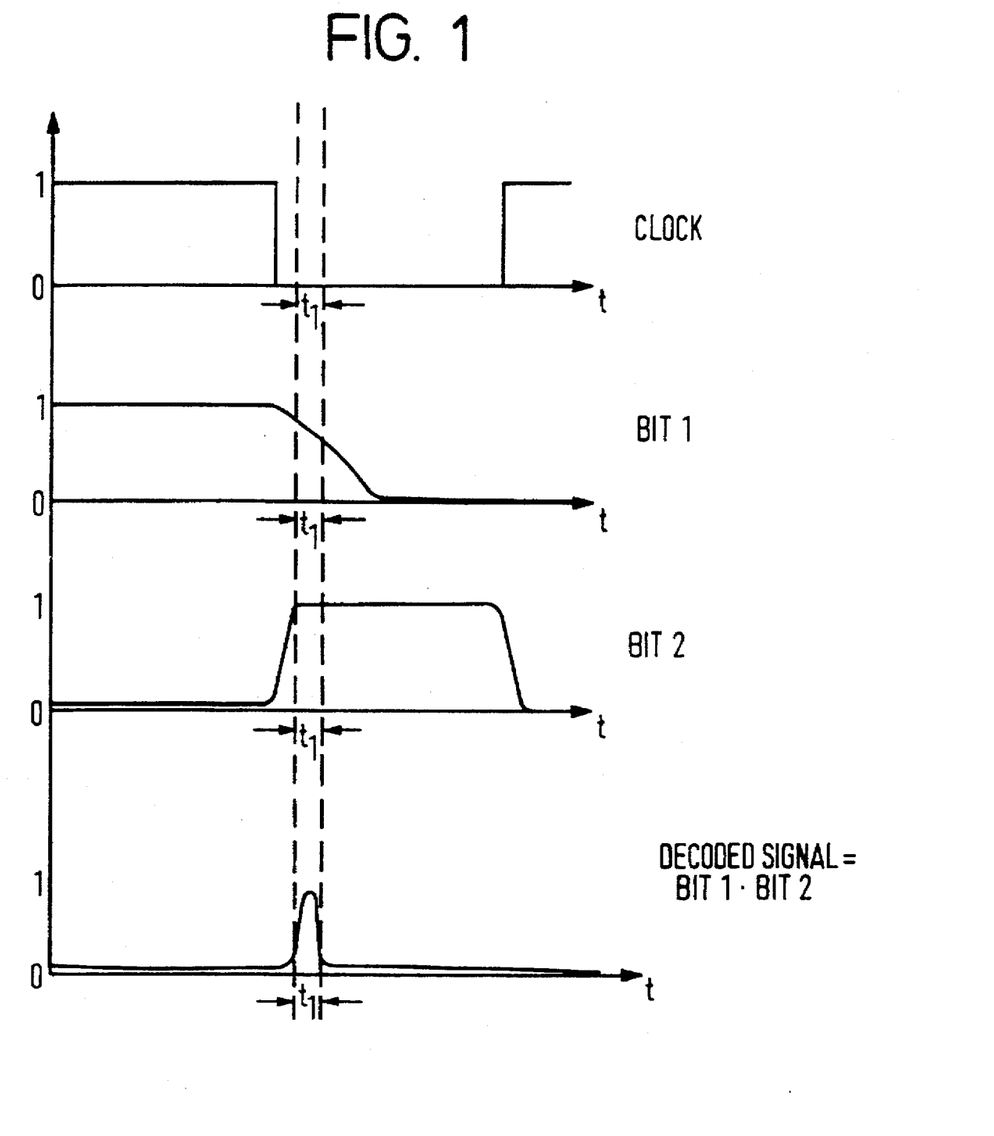
FIG. 1 shows a timing diagram showing a clock signal, two bits of a control bus and a signal decoded from the two bits, illustrating a problem with a prior art arrangement.

This means that the bus is long and heavily capacitively loaded. Large mismatches in the loading of individual bits of the control bus can occur, resulting in different delays associated with each bit of the bus. This problem is illustrated with reference to FIG. 1. In particular, on an edge transition of the clock signal, bit 1 changes from a "1" value to a "0" value whilst bit 2 changes from a "0" value to a "1" value. However, the rate at which these two bits changes state differs significantly due to the capacitive loading. The bits are typically statically decoded so that if the bits were decoded in time period t1, bit 1 could be wrongly decoded as having a "1" value instead of a "0" value. The resulting transit or parasitic state is undesirable and could cause problems as an unrelated decoder may be spuriously activated. For example, if a decoded signal represents BIT 1 ANDed with BIT 2, i.e., BIT 1. BIT 2, then during t1, the decoded signal will be high when it should be low as can be seen from FIG. 1. If this parasitic state defines a valid instruction, an unrelated peripheral circuit may then be accidentally activated.

To avoid this problem, it is usual to latch the values from the bus using, for example a master-slave latch driven by a two phase clock. This entails routing an extra three signals through the chip (the clock signals plus a latch reset signal) and the placement of extra latches within the decoders of the peripheral circuits. This increases the amount of circuitry required and may also slow down the operation of the memory. For example, delays can occur if a verifying operation has to be carried out. When a verify code is issued, the memory chip will do a verify read of the memory array at the current address location. The result of the read determines if for example a program or erase has been successful. A comparator looks at the read data and feeds back the information to the control circuitry. At the end of the verify, the algorithmic flow of the control state machine is determined by the fed back result from the comparator.

Therefore, if the control bus is latched, the state machine must await an extra clock cycle in the verify state so that the code has a chance to reach the relevant peripheral circuitry.

SUMMARY OF THE INVENTION

It is an object of embodiments of the present invention to provide a method and apparatus which is able to reduce the problems of known control bus and circuitry arrangements.

According to a first aspect of the present invention, there is provided a memory device comprising a memory and an input for receiving a plurality of consecutive control signals, said consecutive control signals being in the form of Gray code and said device is operable to carry out, in accordance with said control signals, at least one function in respect of said memory.

By using Gray code for the consecutive control signals, it is possible for embodiments of the present invention to avoid the difficulties of the known control bus and circuitry arrangements. In particular, Gray code has the property that only one bit of a binary sequence is changed in going from one state to the next. Thus successive codes of the consecutive control signals will only differ from the preceding codes by one bit. As only one bit is changing on any one transition, transit states are avoided and the need for latches are also avoided. Furthermore the number of clock signals required to complete a given operation may be reduced, thus increasing the effective speed of the memory.

Additionally, by using Gray code a power saving can be achieved in that the number of signals that have to transit is minimized. In contrast, in known schemes, a number of signals change on each state transit. This is a particular problem for arrangements which have relatively long signal tracks and accordingly relatively high capacitance. The greater the number of signals which change states the greater the power consumption. The use of Gray code may be of advantage in high frequency systems where the level of power consumption may be of importance.

Preferably, said memory comprises a data storage portion and at least one peripheral circuit for carrying out said at least one function in respect of the data storage portion. The at least one function may be programming, erasing and/or reading functions. At least one peripheral circuit may be arranged to allow any one or more of these functions to be carried out. It should be appreciated that a particular peripheral circuit may be used to carry out more than one of the possible functions. Indeed, more than one peripheral circuit may be required to carry out a particular function.

The memory device may also comprise control circuitry operable to provide said consecutive control signals. The control circuitry may be connected to at least one peripheral circuit. The control circuitry may be arranged to act as a state machine. Thus, in response to an input command, the control circuitry may generate a set of coded signals or states representative of a sequence of events that need to be carried out by the peripheral circuits in order to carry out that command.

The control circuitry is preferably connected to the memory by a bus, and said consecutive control signals are provided on said bus. By using a bus, the advantages of a reduced number of outputs from the control circuitry can be obtained.

Preferably two buses are provided, each of which carries the same consecutive control signals but which are driven in opposite directions through the memory device. In this way, it can be ensured that all the peripheral circuits receive the control signals.

There is a potential difficulty in using Gray code. In particular, the maximum number of "fan-in" states is equal to the number of bits of the signal. The number of fan-in states represents the number of different states which can precede and/or follow a single state. To avoid this difficulty, it is preferred that the Gray code control signals use at least one dummy code which can be combined with an adjacent code to represent a single state so that the maximum number of states that can precede or succeed one given state is effectively greater than the number of bits of the control signal. Alternatively or additionally, the same state may be represented by two different codes. Both of these codes may then be followed by the same or different codes. In this way the number of "fan-in" states can be increased so as to be greater than the number of bits. Whilst this may mean that the number of codes, and hence the cycle time, are increased in many embodiments of the invention, this increased cycle time may be of little or no significance.

Preferably, the memory device is a flash EPROM. However it will be appreciated that the present invention is also applicable to other memory devices including EEPROMs and other non-volatile memories. Where the memory device is in the form of a flash EPROM, the flash EPROM preferably has an array of single transistor memory cells constituting the memory. This array may be controlled by a number of peripheral circuits which allow the array to be programmed, erased or read. These peripheral circuits may, in turn, be connected to a control bus or buses via respective decoders.

According to a second aspect of the present invention, there is provided a memory device comprising a data storage portion, at least one peripheral circuit connected to said data storage portion for carrying out a function with respect to said data storage portion and control circuitry connected to said at least one peripheral circuit and operable to provide a plurality of consecutive signals for controlling the function of said at least one peripheral circuit, said consecutive signals being generated by said control circuitry in the form of Gray code.

According to a third aspect of the present invention, there is provided a method for carrying out at least one function in respect of a memory of a memory device, said memory device also having at least one peripheral circuit connected to said memory and operable to carry out said at least one function, said method comprising generating a plurality of consecutive control signals, said control signals being generated in the form of Gray code and applying said plurality of consecutive control signals to said at least one peripheral circuit, said control signals controlling said at least one peripheral circuit to permit said at least one function to be carried out in respect of said memory.

According to another aspect of the present invention, there is provided a memory array comprising a plurality of memory cells, peripheral circuitry connected to said cells for controlling said cells, said peripheral circuitry including a plurality of separately operable decoders each arranged to control a respective peripheral circuit of said peripheral circuitry, and a control circuit having an input for receiving operation instructions for the memory array and an output connected to a bus interconnecting said control circuit with each of said decoders, said control circuit being operable to output signals in Gray code.

According to a further aspect of the present invention, there is provided a method of operating a flash EPROM memory array comprising operating memory cells by a plurality of peripheral circuits connected to respective groups of memory cells, each peripheral circuit having a respective decoder arranged to selectively operate the peripheral circuit, the method including distributing to each decoder Gray coded control signals on a bus network.

BRIEF DESCRIPTION OF THE DRAWINGS

Embodiments of the present invention will now be described with reference to the accompanying drawings in which:

FIG. 8b illustrates a solution to the problem illustrated in FIG. 8a.

DETAILED DESCRIPTION OF THE INVENTION

Figure 2:
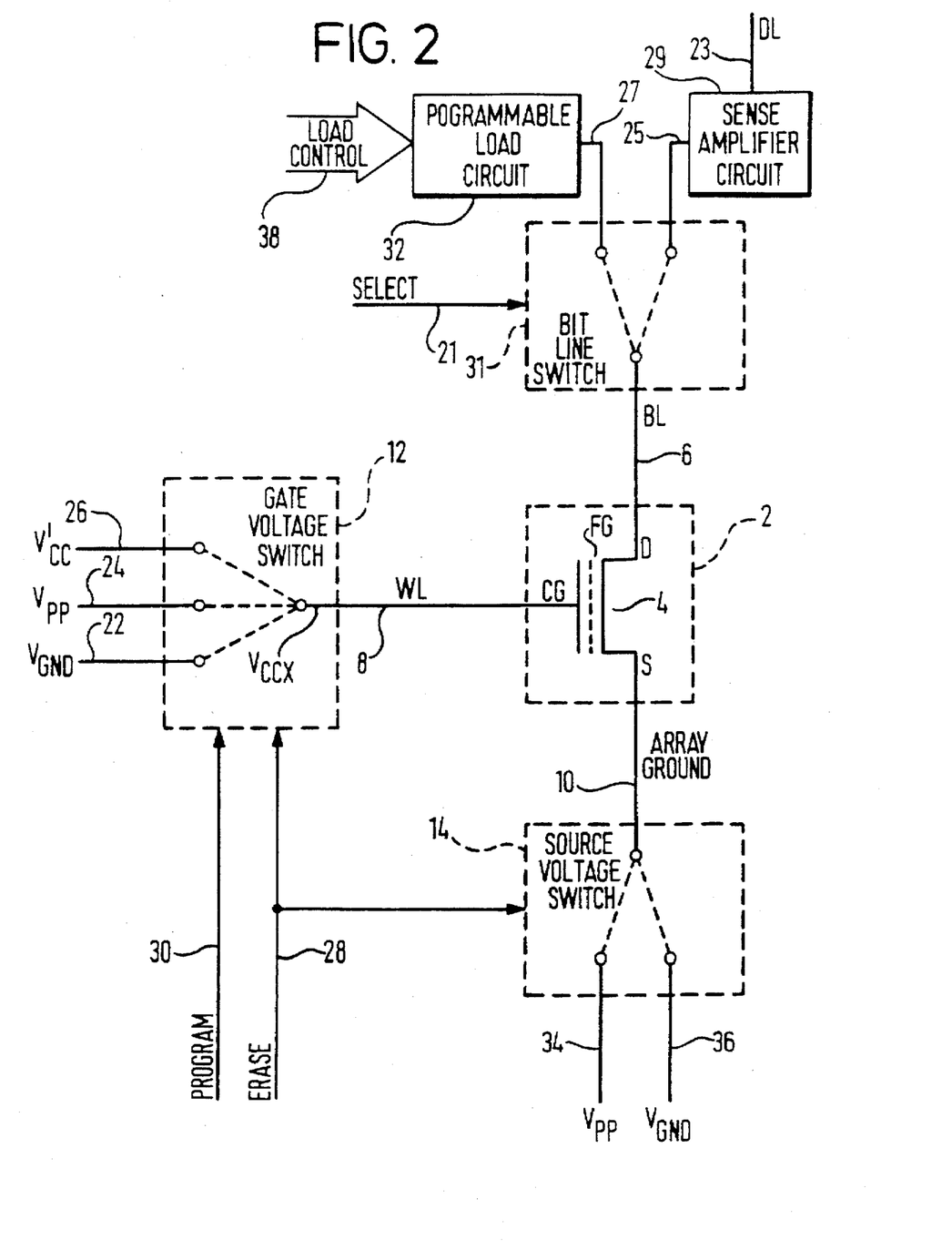
FIG. 2 is a schematic diagram of a flash memory cell.

FIG. 2 illustrates a flash memory cell 2 comprising a single floating gate transistor 4 having a control gate CG, a floating gate FG, a source S, and a drain D. The source S of the floating gate transistor 4 is connected to an ARRAY GROUND signal on line 10. Through a source voltage switch circuit 14 this line 10 can be at a ground voltage VGND or a high voltage Vpp. Voltage Vpp typically represents a programming potential (typically 12V) and voltage VGND represents device ground. Vpp is normally connected to array ground via a resistor (not shown). The source voltage switch 14 is connected to the voltage Vpp via line 34 and the voltage VGND via line 36. The control gate CG of the floating gate transistor 4 is connected to a gate voltage switch 12 by a word line (WL) 8. The gate voltage switch 12 is further connected to voltages V'cc, Vpp and VGND on lines 26, 24 and 22 respectively. V'cc is at 5V for a 5V part or is boosted to about 5V for a 3V part. These switches 14 and 12 each receive a control signal ERASE on line 28 and additionally the gate voltage switch 12 receives a control signal PROGRAM on line 30. The drain D of the floating gate transistor 4 is connected to a bit line switch 31 by a bit line (BL) 6. The bit line switch is further connected to the input of a programmable load circuit 32 on line 27 and the input of a sense amplifier circuit 29 on line 25. The output of the sense amplifier circuit 29 on line 23 forms a data line (DL). The switch 31 receives a control signal SELECT on line 21. The programmable load circuit 32 receives load control signals on lines 38.

The flash memory has three modes of operation: program, erase and read. Each of these modes will be described hereinafter with reference to FIG. 2. The program mode involves writing a "0" to a memory cell or group of memory cells, the erase mode involves removing a "0" from any cell that has a "0" stored in it such that the cells all effectively store "1"s, and the read mode involves reading a cell to establish whether it is programmed or erased, i.e., contains either a "0" or a "1".

During a program mode, the control signal PROGRAM on line 30 is set such that the gate voltage switch 12 is configured to connect the voltage Vpp on line 24 to the control gate CG of transistor 4 via word line 8. As the control signal ERASE on line 28 is not set, the source voltage switch 14 is configured to connect the voltage VGND on line 36 to the source of transistor 4 via the ARRAY GROUND signal line 10. The control signal SELECT on line 21 is set such that the bit line on line 6 is connected to the programmable load 32 by line 27. The load control signals 38 are set such that the programmable load 32 is controlled such that a voltage of about 5V is on the drain D of the transistor 4 via the bit line 6. As a result of these signals applied to the transistor 4, the floating gate FG becomes negatively charged. The negative charge shifts the threshold voltage of the floating gate transistor making it less conductive. The amount of negative charge accumulated at the floating gate depends on the duration for which the control signal PROGRAM is set. In this way, a "0" is written into the cell. Normally, several program pulses are needed, each pulse being followed by a verify cycle.

During an erase mode, the control signal ERASE on line 28 is set such that the gate voltage switch 12 is configured to connect the voltage VGND on line 22 to the control gate CG of the transistor 4 via the word line 8, and such that the switch 14 is configured to connect the voltage Vpp on line 34 to the source S of the transistor 4 via the ARRAY GROUND line 10. The control signal SELECT on line 21 is again set such that the bit line 6 is disconnected so that it floats at a voltage of just under 1V. As the floating gate transistor is fabricated such that the source region in the substrate underlies the floating gate, any negative charge on the floating gate will be reduced. The amount of negative charge removed from the floating gate FG depends on the duration for which the ERASE signal on line 28 is set. The reduction of negative charge shifts the threshold voltage of the floating gate transistor making it more conductive. In this way the state of the cell is restored to "1". Normally, several erase pulses are required, each erase pulse being followed by a verify cycle.

During a read mode, neither the control signal ERASE on line 28 nor the control signal PROGRAM on line 30 are set. Consequently, the V'cc signal on line 26 is connected by the source voltage switch 12 to the control gate of the transistor 4 via the word line 8 and the voltage VGND on line 36 is connected to the source of the transistor 4 via the ARRAY GROUND signal line 10. The bit line 6 is biased to approximately 1 volt prior to a read operation by a bit line load (not shown) within the sense amplifying circuit. During a read operation, for an erased cell (with "1" stored in it) the conductivity of the cell is such that current passes through the cell when the bit line is connected for sensing. For a programmed cell (with a "0" stored in it) substantially no current is passed by the cell. The current drawn (or not) by the cell is compared with a reference current to detect the status of the cell.

The operation of a flash cell in a memory array will now be described with reference to FIG. 3. Signal lines or circuitry common to FIG. 2 can be identified in FIG. 3 by use of the same reference numerals. Voltage supplies have not been illustrated in FIG. 3 for reasons of clarity, but it will be understood with reference to FIG. 2 which voltages are required in various parts of the circuit.

Figure 3:
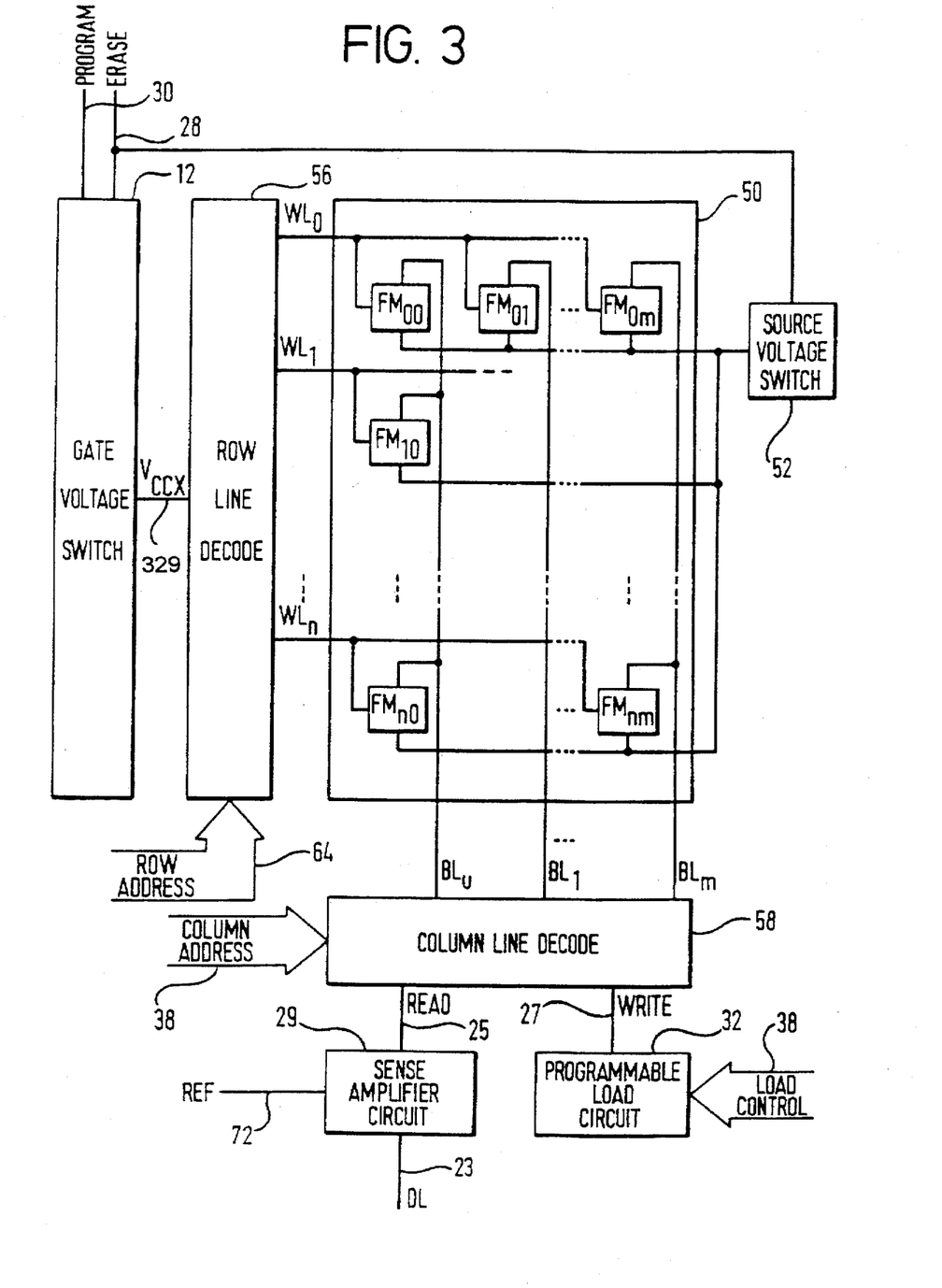
FIG. 3 is a schematic diagram of a flash memory array.

FIG. 3 illustrates a flash memory array 50 comprising a plurality of flash memory cells FMoo . . . FMnm, arranged in rows and columns, each of which can be the same as the cell 2 shown in FIG. 2. The gates of the transistors in each memory cell in a row are commonly connected to a respective word line WLo . . . WLn addressable by a row line decode circuit 56 which receives the row address 64. The gate voltage switch 12 responds to the control signals PROGRAM and ERASE on line 30 and 28 respectively, and supplies the appropriate gate voltage Vccx on line 329 to be switched to the addressed wordline through the row decode circuit 56.

The drains of each transistor in a column are commonly connected by bit lines BLo . . . BLm to a column line decode circuit 58. The column line decode circuit can be considered as a plurality m of the bit line switch circuits 31, with the SELECT signal being generated responsive to the column address 38. The output of the column line decode circuit 58 on line 25 is a read output and is connected to the sense amplifier circuit 29. The sense amplifier 29 contains sense amplifiers and bit line load circuits. The column line decode circuit receives a write input on line 27 from the programmable load circuit 32. The programmable load circuit is controlled by the load control signals 38. During a program or erase operation the bit lines BLo to BLm are selectively connected to the programmable load circuit 32. During a read operation the selected bit line (or bit lines) is connected to a sense amplifier in the sense amplifier circuit 29. The sense amplifier circuit 29 also receives a reference signal REF on line 72 and generates an output signal on the data line (DL) on line 23.

Figure 4:
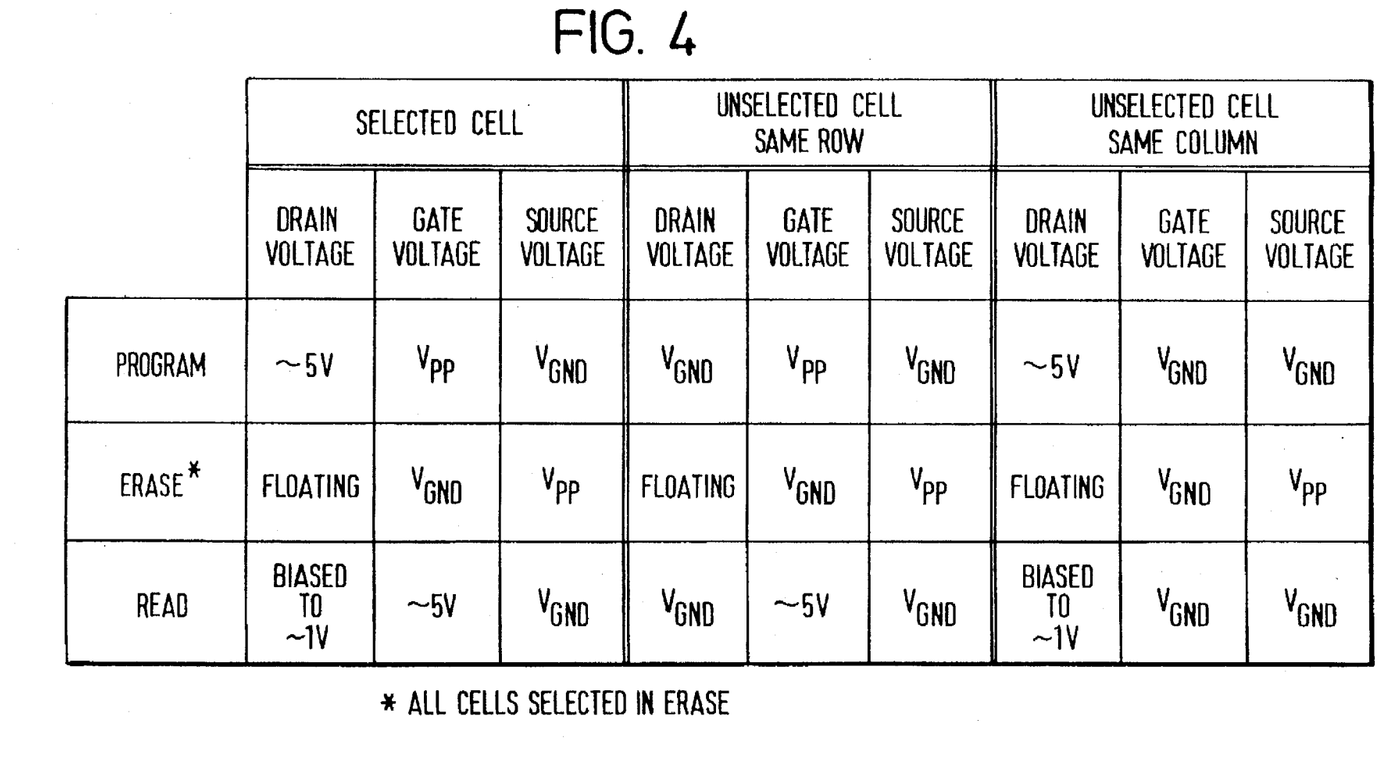
FIG. 4 is a table of the voltages which need to be applied to selected and unselected cells for each of a program, erase and read operation.

It will be appreciated that when a particular cell is chosen to be programmed, the programming load will only be applied to a selected column so that other cells in the same row as the selected cell are not inadvertently programmed. In addition, in general during read and program operations, it is desirable to apply certain signals to cells in the array which have not been selected to improve the performance of the cell, as is well known in the art. During an erase operation, every cell in the memory array is erased, although it will be appreciated by a person skilled in the art that an array could be split into sectors for erasing so that only part of the array is erased at any one time. The table of FIG. 4 shows the voltages which need to be applied to the selected and unselected cells for each of a program, erase and read operation.

Figure 5:
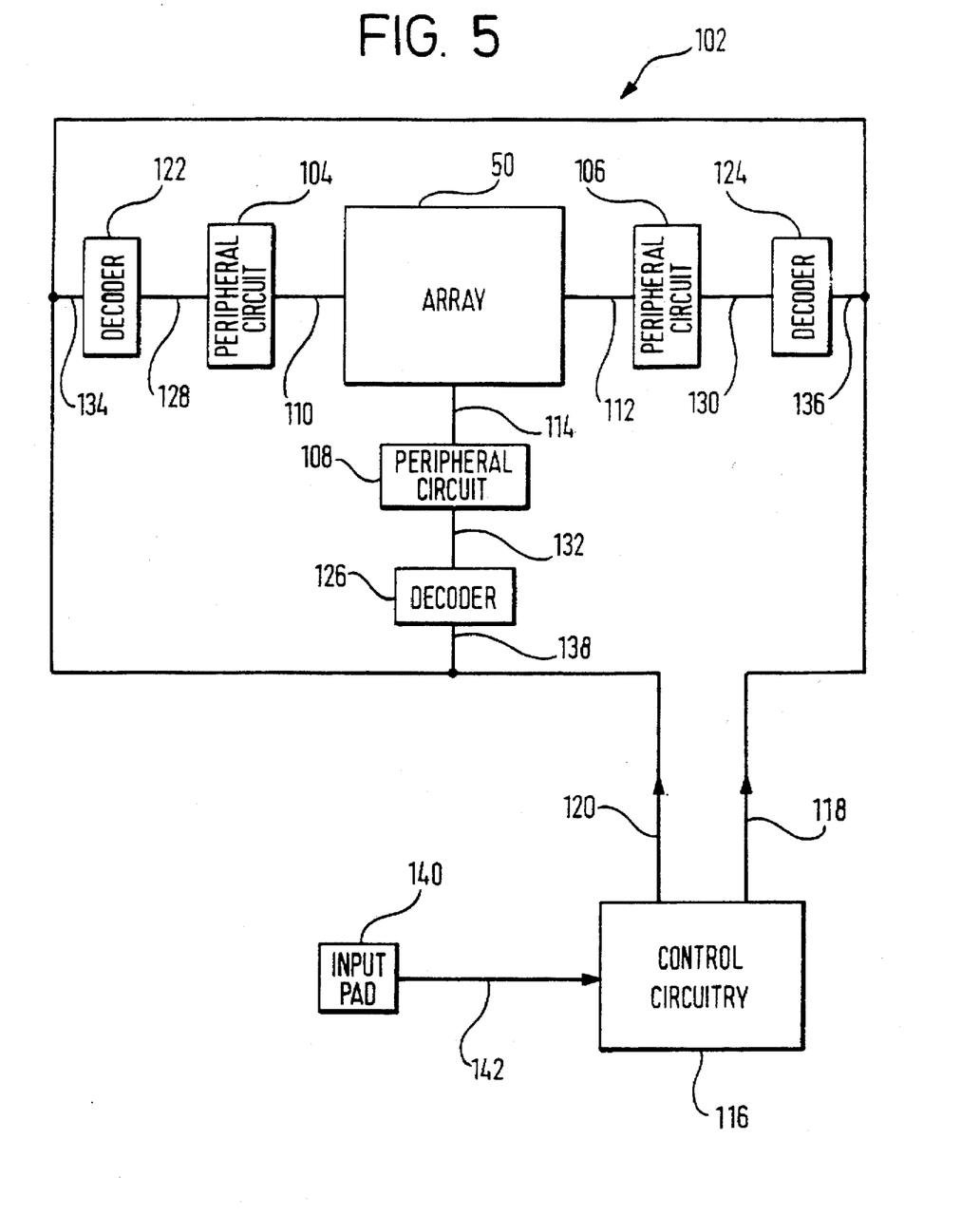
FIG. 5 is a schematic diagram of a preferred embodiment of the invention.

Reference will next be made to FIG. 5 which shows a schematic view of an embodiment of the present invention which shows part of a flash EPROM 102. The memory used in FIG. 5 may be of the same type as that of FIGS. 2 to 4 and where appropriate, the same reference numerals will be used. The flash EPROM circuit 102 has an array 50 of programmable single transistor cells connected to peripheral circuits 104, 106 and 108 via lines 110, 112 and 114 respectively. These circuits 104, 106 and 108 allow the array to be programmed, erased and read. These peripheral circuits 104, 106 and 108 are shown schematically and could for example correspond to the sense amplifier circuit 29, the bit loading circuit and the word line, and the word line switching circuit (gate voltage switch) 12 described in relation to FIG. 3. However the peripheral circuits will be described in more detail hereinafter with reference to FIG. 6.

The flash EPROM circuit 102 also has control circuitry 116. Control circuitry 116 acts as a state machine and provides control signals which determine which of the peripheral circuits 104, 106 and 108 are activated and what function they carry out. Signals from the control circuitry 116 are provided on buses 118 and 120. The signals on buses 118 and 120 are identical but are driven in opposite directions around the flash EPROM circuit 102. This is to ensure that each peripheral circuit receives the control signals.

The flash EPROM circuit 102 also has decoders 122, 124 and 126 which are connected to peripheral circuits 104, 106 and 108 respectively via lines 128, 130 and 132. The decoders 122, 124 and 126 receive at their inputs 134, 136 and 138 respectively, the signals carried by buses 118 and 120 and decode these signals. If a decoded signal represents a valid function, the respective decoder outputs a signal via line 128, 130 or 132 to instruct the respective peripheral circuit 104, 106 or 108 to carry out the function defined by that particular coded signal which for example allows the array 50 to be programmed, erased or read.

The control circuitry 116 in turn responds to an input command generated by, for example, a user with an input pad 140. The input pad 140 is connected to control circuitry 116 via line 142. The input command is interpreted by the control circuitry 116 which acts as state machine to provide a sequence of coded signals which represent the steps which need to be carried out to implement the input command. The coded signals are output on buses 118 and 120 and conveyed to the respective peripheral circuits to allow the user command to be carried out.

The sequence of codes generated by the control circuitry 116 and sent on buses 118 and 120 is in the form of Gray code. Gray code has the property that only one bit changes in going from one state to the next. Thus, the successive signals on the buses 118 and 120 will only differ from the preceding signal by one changed bit. In this way, transit states cannot arise as there are no intermediate states possible between two consecutive coded signals. The need for the latches required in the prior art is thereby eliminated and the resultant disadvantages of using latches avoided.

Figure 6:
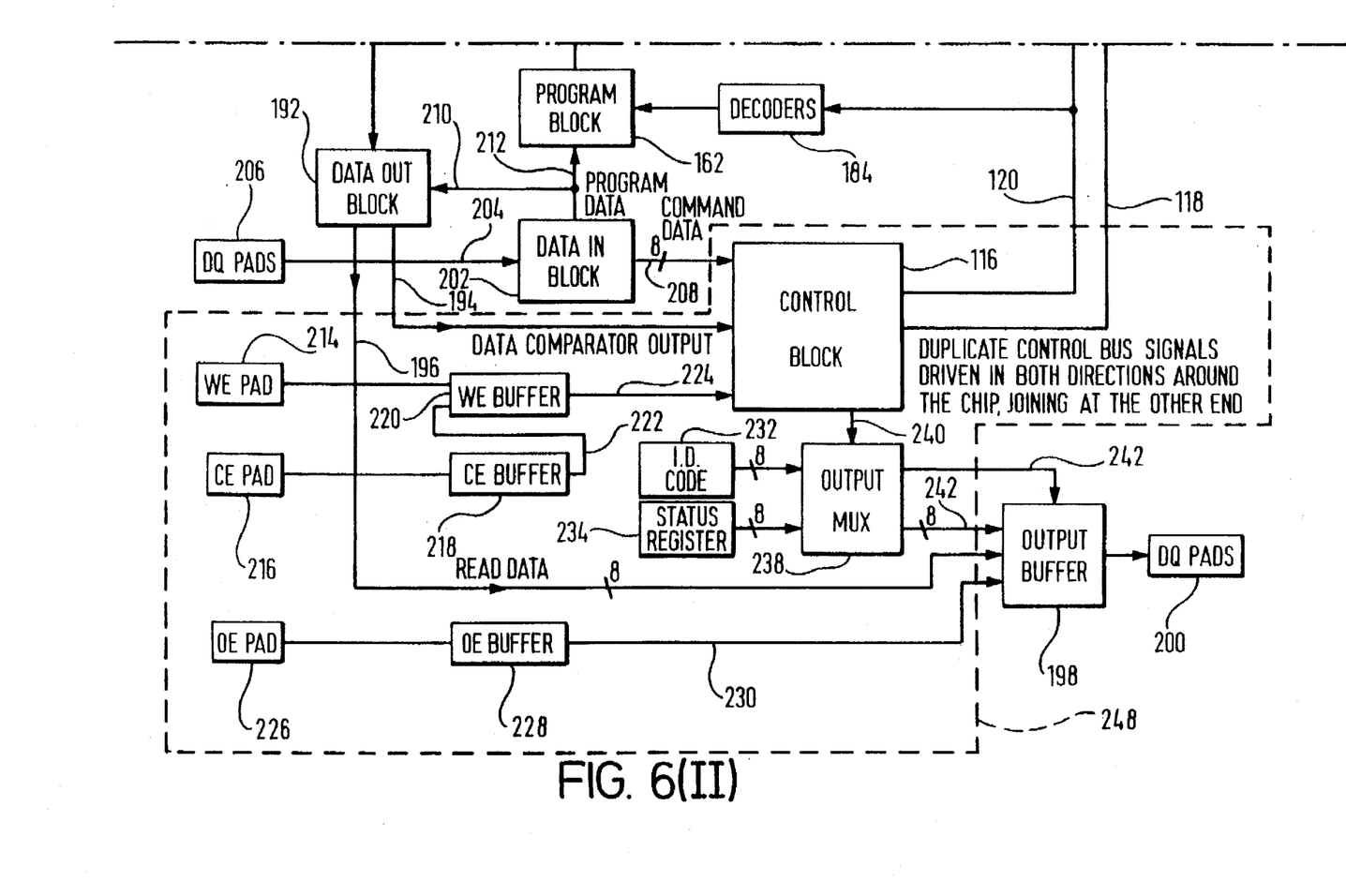
Figure 6I:
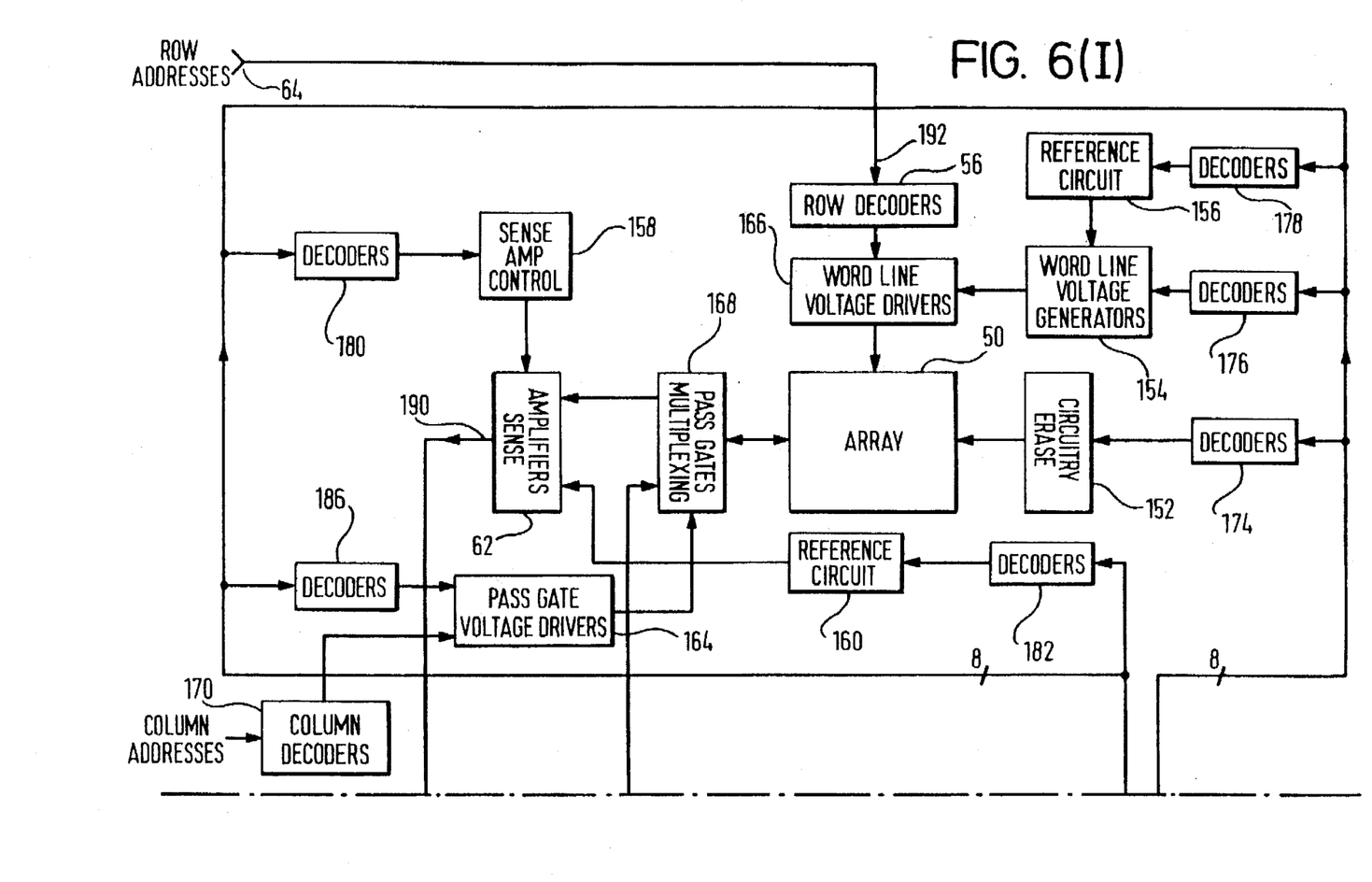
FIGS. 6I and 6II is a more detailed block diagram of the general architecture of a flash EPROM incorporating an embodiment of the present invention.

A more detailed architecture of a flash EPROM can be seen from FIG. 6. The same reference numerals used in the preceding Figures will also be used in FIG. 6 wherever appropriate.

The array 50 is surrounded by seven peripheral circuits 152-164. The first peripheral circuit 152 is an erase circuit for erasing values contained in the cells of the array 50. In particular, the erase circuitry 152 can be regarded as being equivalent to the source voltage switch 52 of FIG. 3. Thus, the erase circuitry keeps the source voltages of each cell at ground except during erasing when all the source voltages will be at Vpp.

The next peripheral circuit 154 is the word line voltage generating circuit. The voltage on the word line is supplied via word line voltage driver 166 to the gates of the transistor cells forming the array. As discussed earlier, the voltage on the word line (i.e., gate voltage) can be Vpp, ground or around 5V depending on whether a program, erase or read operation is being carried out and whether or not the cell is a selected cell. The word line can also be placed at voltages for other commands, for example ~7V for program verify and ~5V for erase verify. Furthermore, during a read operation, Vcc is passed to the word line (Vcc is usually 5V) whilst during verify operations the voltage is generated from Vpp. Peripheral circuit 156 is a reference circuit for the word line voltage generator circuit 154 and provides an accurate reference voltage which allows the voltage generator 154 to generate accurately the voltage output to the word line voltage driver 166. The word line voltage generator 154, the word line voltage driver 166, and the reference circuit 156 generally correspond to the word line switching circuit 54 shown in FIG. 3.

Peripheral circuit 158 is arranged to control sense amplifiers 62. As discussed earlier, the sense amplifiers 62 are arranged to detect and amplify the charge on the floating gate of a selected transistor cell during a read operation. The amount of charge on the gate defines whether the cell is programmed with a "1" or "0" voltage value. In particular the sense amplifier 62 compares the current drawn by a selected cell with a reference current which is generated by a peripheral reference circuit 160. If the cell has a "1" value, a current will be drawn by the cell, which is greater than the reference current. If on the other hand the cell has a "0" value, a current lower than the reference current will be drawn by the cell. As a result of the comparison with the reference current, the sense amplifier 62 is able to determine the value which is programmed in the selected cell. In order to read a selected cell, a sense amplifier 62 will bias the drain voltage and thus the corresponding bit line to around 1V.

Peripheral circuit 162 is a programming circuit and corresponds to the bit line loading circuit 60 of FIG. 3. In particular the programming circuit 162 provides a voltage of around 5V to the bit line of a selected cell to be programmed. Otherwise the gate voltage is allowed to float.

The final peripheral circuit is a pass gate voltage drivers 164. The sense amplifiers 62, pass gate voltage drivers 164 and programming circuit 162 are all connected to a pass gate multiplexing circuit 168. The pass gate multiplexing circuit 168 determines which bit lines are to have a programming voltage of 5V applied thereto and which bit lines are to be connected to respective sense amplifiers 62 during respective programming and reading operations. The pass gate voltage driver 164 provides the activating voltage for the pass gate multiplexing circuit 168.

The pass gate voltage driver 164 receives an input from a column decoder 170 which in turn has a column address input 172. The column decoder 170, pass gate voltage drivers 164 and pass gate multiplexing circuit 168 can be regarded as being equivalent to column line decode circuit 58 of FIG. 3.

Each peripheral circuit 152-164 is provided with its own decoder 174-186 respectively which decodes the signals on the control buses 118 and 120 and if the signal represents a valid instruction, causes the peripheral circuit in question to carry out the required function. It should be noted that these peripheral circuits 152-164 and decoders 174-186 correspond generally to the peripheral circuits 104-108 and decoders 122-126 shown schematically in FIG. 5.

The flash EPROM 102 also has row line decoders 56, the output of which is connected to the word line voltage drivers 166. The row decoders 56 in turn receives row addresses 64 at their input 192. The row line decoders 56 in combination with the column decoders 170 determine which cell is to be selected for programming or reading. (The erasing operation occurs simultaneously for all cells of the array).

The output 190 of the sense amplifier 62 is received by a data out circuit 192 which in turn has two outputs 194 and 196. Output 194 is received by the control circuitry 116. The other output 196 of the data output circuit 192 is connected to an output buffer 198. The output buffer 198 allows the read data to be output to an input/output device 200. The input/output device 200 may be in the form of a bond pad. This input/output device 200 corresponds generally to the input pad 140 shown schematically in FIG. 5.

The flash EPROM also has a data input circuit 202 which receives an input 204 from an input/output device 206 which may be the same as the input/output device 200. The data input circuit 202 has an output 208 to the control circuitry 116. The input from the input/output device 206 provides a user command to the control circuitry 116. The control circuitry 116 generates in response to that input command a sequence of codes which are sent around the flash EPROM chip on buses 118 and 120 to the respective peripheral circuits. The data input circuit 202 has an output 210 to the data output circuit 192 where a comparison of the data read and the data to be input can be made. Thus output 194 of the data circuit contains an indication as to whether the data that should have been programmed into the respective cells 50 has actually been programmed into those cells. Likewise, an erase operation can be similarly verified by checking that all the cells are programmed with a "1" value. The data input circuit also has an output 212 to the programming circuit 162 which thus receives an indication that the programming voltage is to be applied to a particular bit line. The outputs 210 and 212 of the data input circuit 202 are in fact a common output which is then directed both to the data output circuit 192 and the programming circuit 162.

The flash EPROM 102 also has a write enable input 214 and a chip enable input 216. The chip enable input 216 is connected to a chip enable buffer 218 whilst the write enable input 216 is connected to a write enable buffer 220. The output 222 of the chip enable buffer 218 is connected to the write enable buffer. The output 224 of the write enable buffer 220 is connected to the control circuitry 116. In general, the write and chip enable signals act as control signals. For example, the chip and write enable signals can act as clocks or latching signals when a command, present on input/output devices 200 or 206, is to be loaded. The flash EPROM also has an output enable input 226 which is input to an output enable buffer 228. The output 230 of the output enable buffer 228 is received by the output buffer 198. The chip can only provide an output when there is an output enable input 226.

Finally, the flash EPROM has identification code circuitry 232 and a status register 234, both of which have an output to the output multiplexor 238. The output multiplexor 238 has an input 240 from the control circuitry 116 and two outputs 242 and 244 to an output buffer 198. The outputs 242 and 244 of the output multiplexor 238 are able to provide information on the status of the chip and an indication as to the type of chip. The information concerning the type of chip can for example be in the form of a manufacturer's code.

It will be appreciated that block 248 of the chip can be generally regarded as control circuitry for the memory part of the chip.

Figure 7:
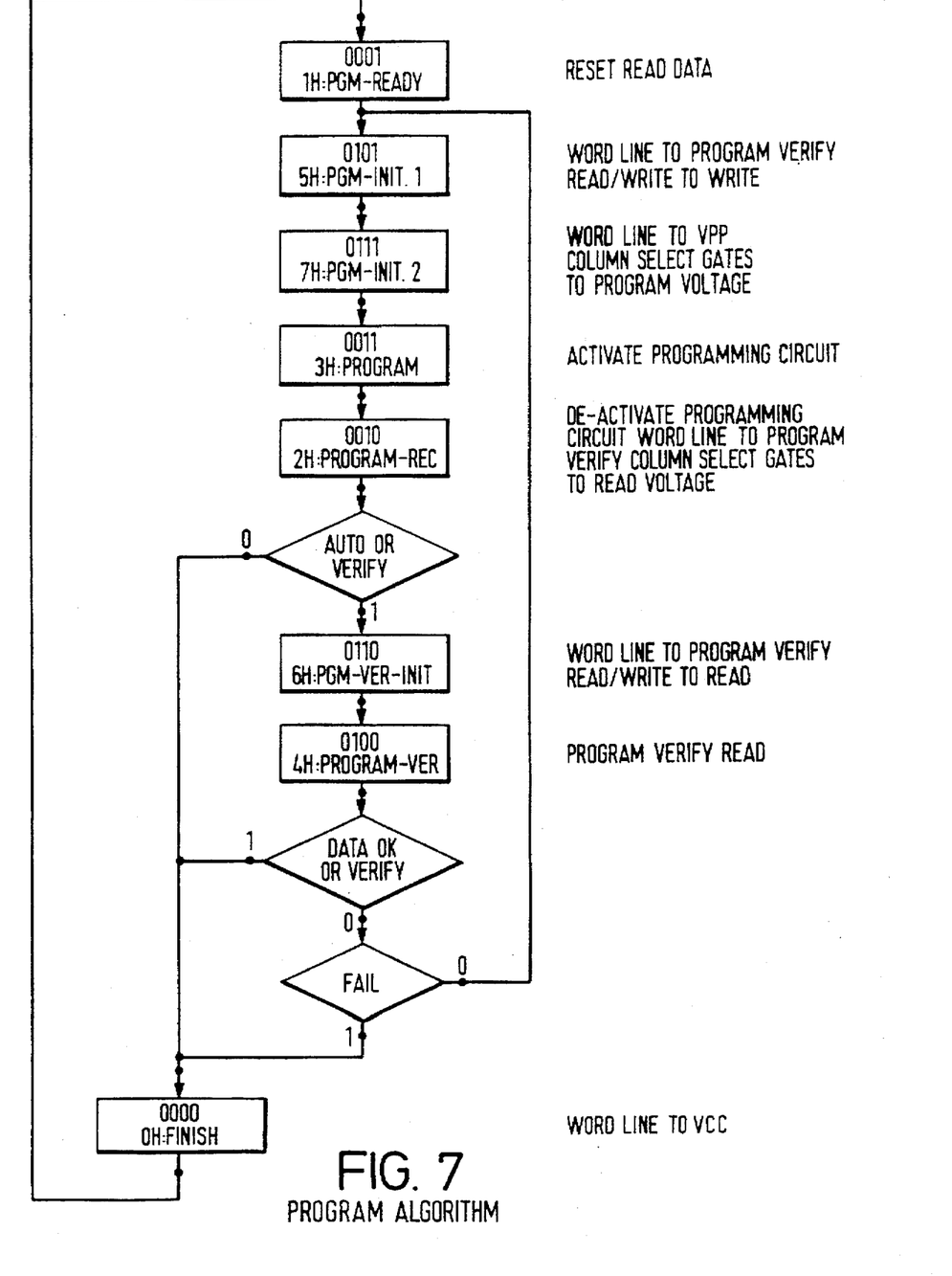
FIG. 7 is a flow diagram of an algorithm for carrying out a programming operation, embodying the present invention.

FIG. 7 shows in flow diagram form an algorithm for programming the array 50. The program consists of a number of consecutive Gray code values which are generated by the control circuitry 116 in response to an input command from the input/output device 206. Initially a signal 0001 is provided to reset the read data. The outputs of sense amplifiers 62 are thus reset by the sense amplifier control circuit 158 so as not to be operably connected to any of the bit lines.

The next signal 0101 sets the selected word line to program verify. In other words, the selected word line voltage is set to around 7 volts. The word line voltage is of course controlled by the word line voltage generator 154, its reference circuit 156 and the word line voltage driver 166. This code also sets read/write to write. Thus the pass gate multiplexing circuit 168 is set to programming mode by a signal from the pass gate voltage generator 186 and thus is ready to provide the programming voltage on the selected bit line or lines.

The next signal 0111 sets the word line voltage of the selected cell to Vpp, the programming voltage. Again, the word line voltage is controlled by the word line voltage generator 154, its reference circuit 156 and the word line voltage driver 166. The column decoders 170 also receive the column addresses 172 which indicate which word line and hence which gates are to be at the programming voltage Vpp. The output of the column decoders 170 is received by the pass gate multiplexing circuit 168 via the pass gate voltage driver 164.

0011 is the next coded signal provided on the buses 118 and 120. This code activates the programming circuit 162 which provides 5V on the selected bit line. Thus the output of the programming circuit, along with the addresses 172 input to the pass gate multiplexing circuit, allow the selected cell or cells to be programmed with a "0" value.

The next coded signal 0010 deactivates the programming circuit 162 to end the programming operation. The word line is again selected to be at program verify, i.e., at around 7 volts. Column addresses input to the column decoder determine which of the cells are to be read. This will usually be the same cells which have just been programmed.

In order to explain the subsequent stages of the algorithm, it should be appreciated that there are two techniques that can be used to control a flash EPROM. In the first technique the flash EPROM chip is controlled by the system in which the flash EPROM chip 102 is placed and is usually referred to as "CPU controlled" or "user controlled". In the second technique, the control of the programming and erasing operation is handled internally by the flash EPROM chip and the host system is only informed when the operation is complete and whether or not it was successful. The second technique is generally referred to as "embedded control" or "auto-control" and is more complex to implement.

Separate program/erase commands and equivalent verify commands are provided for a CPU controlled flash EPROM chip by the system in which the flash EPROM chip is placed. For example, the user issues a program command and then performs a verify operation to compare the verify data read from the flash EPROM chip with the original program data and if they are different causes another program/verify cycle to be performed. The user also has to count the number of cycles and abort the process if a limit is reached to prevent an infinite loop being entered when a cell fails.

In contrast, in an auto controlled flash EPROM chip, the data verifying operation is carried out internally and a failure counter is provided to count the number of cycles to thereby detect a failed cell. Thus the user loads a program command and simply checks a status register at intervals to see whether the command has been carried out.

The flash EPROM chip 102 embodying the present invention is arranged to be capable of using either of these two techniques. This can be achieved by changing a permanently stored value in a UPROM (a cell that is not usually accessible except during a special test mode) which can be done at the production stage.

Reference will now be made to the algorithm of FIG. 7. After the programming deactivating step defined by code 0010, if the command is not AUTO (i.e., the flash EPROM is auto-controlled) or VERIFY (i.e., the flash EPROM is user controlled and has received a program verify command) then the algorithm finishes and the next code would be 0000.

This would occur when the flash EPROM chip is user controlled and only a program command has been provided by the user (i.e., no verify command has been provided).

If on the other hand the command is AUTO or VERIFY, then the next code would be 0110. In the verify mode, the word line is set to program verify, i.e., around 5 volts by the word line voltage driver 166, the word line voltage generator 154 and its reference circuit 156. The read/write line is set to read. In other words, the pass gate multiplexing circuit 168 allows the sense amplifiers 62 to be coupled to the relevant bit lines.

The next code 0100 allows the program data to be verified by being read. The sense amplifiers, controlled by the sense amplifier control circuit 158 thus reads the data input into the selected cells.

If the data is correct as indicated by the DATA_OK signal going high, in the case of an auto-controlled flash EPROM, or the external system is verifying the data in the case of a user controlled flash EPROM, then the next code will be 0000 and the algorithm is ended.

If on the other hand, the flash EPROM is auto-controlled and the data is incorrect, then the failure counter determines the number of previous verify operations which have been carried out. If the number of program cycles is less than a predetermined number n, then the algorithm is repeated. If on the other hand, the number of program cycles previously carried out is equal to the predetermined number n then the next code is 0000 and the algorithm is finished.

The final state 0000, which represents the end of the program algorithm, sets the word line to vcc, i.e., around 5 volts. This is again achieved by the word line voltage driver 166, the word line voltage generator 154 and its reference circuit 156.

As will be appreciated, the programming algorithm is such that successive codes only differ by one changed bit. This is even the case where there are more than one possibilities for a successive code. For example the code 0010 can be followed by the code 0000 or 0110. Both of these codes satisfy the Gray code criteria.

Figure 8A:
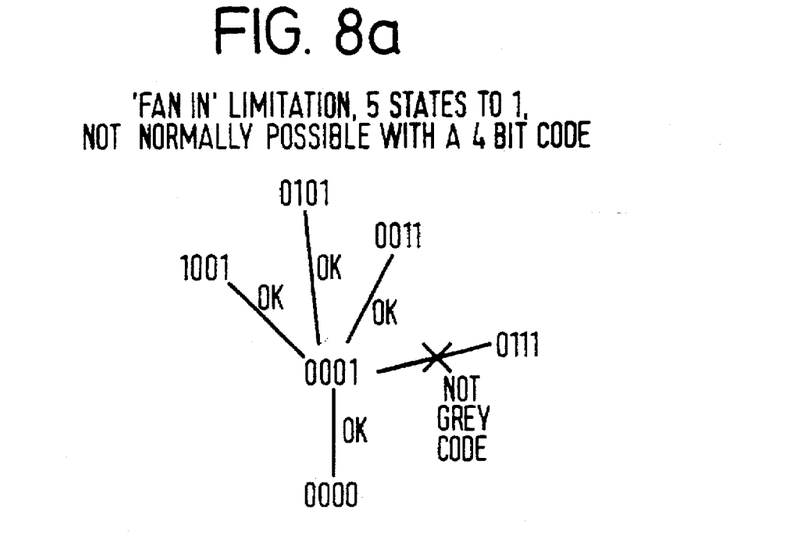
FIG. 8a illustrates a potential difficulty caused by the use of Gray code.
Figure 8B:
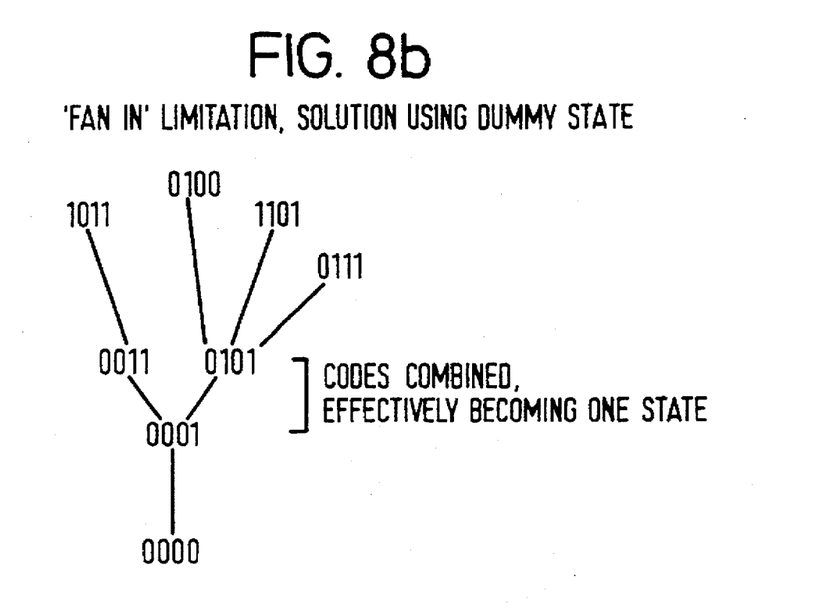

Reference will now be made to FIGS. 8a and 8b. FIG. 8a shows a difficulty with using Gray code. In particular, in the example shown, the control code consists of four bits. The number of bits represents the maximum number of "fan-in" states, i.e., the number of states which can precede and succeed a single state. Thus, if for example four different codes of four bits and representative of four different instructions can all be followed by a single instruction, and that single instruction can itself by followed by another single instruction, then one of the five states which can precede or succeed that single state will not be defined in Gray code, as illustrated in FIG. 8a. This would obviously defeat the advantages of using Gray code. There are two ways in which this problem can be tackled. Firstly, the number of bits in the control signals can be increased. Alternatively, the use of dummy codes can overcome this problem. As can be seen from FIG. 8b, there are four different states which can all be followed by a single state which itself is followed by a further state. However, as can be seen, there are three different codes which all represent the same instruction. The dummy state may be combined with the state before or after it by the decoder, which effectively ignores the bit changing between them. This does, however, mean that the peripheral circuit activated by the combined state cannot have a minimum one cycle timing. This should not unduly effect the performance of the memory. The use of dummy states is of particular use in complex algorithms, i.e., algorithms far more complex than that illustrated by way of example in FIG. 7. Alternatively, this problem can be solved by having two or more codes representing a given state. The decoders would then respond identically to those two or more codes.

Whilst the present invention has been described particularly in relation to a flash EPROM, it will be appreciated that this invention can be applicable to other devices, including, for example, EEPROMs or non-volatile memories.

I claim:

1. A memory device comprising a memory and an input for receiving a plurality of consecutive control signals, said consecutive control signals being in the form of Gray code and said device is operable to carry out, in accordance with said control signals, at least one function in respect of said memory, the at least one or each function being defined by the plurality of control signals.

2. A memory device as claimed in claim 1, wherein said memory comprises a data storage portion and at least one peripheral circuit for carrying out said at least one function in respect of said data storage portion.

3. A memory device as claimed in claim 1, wherein said at least one function to be carried out is at least one of the following functions:

reading, programming, erasing.

4. A memory device as claimed in claim 2, further comprising control circuitry operable to provide said consecutive control signals, said control circuitry being connected to at least one peripheral circuit.

5. A memory device as claimed in claim 1 further comprising control circuitry, said control circuitry being operable to provide said consecutive control signals.

6. A memory device as claimed in claim 5, wherein said control circuitry is connected to the memory by a bus and said consecutive control signals are provided on said bus.

7. A memory device as claimed in claim 5, wherein said control circuitry is a state machine which is operable, in response to an input command, to generate said consecutive control signals.

8. A memory device as claimed in claim 1, wherein the Gray code control signals used have at least two different codes which represent a single state.

9. A flash eprom incorporating a memory device as claimed in claim 1.

10. A memory device comprising:

a memory;

at least one peripheral circuit for carrying out at least one function in respect of said memory;

control circuitry operable to provide a plurality of control signals, said consecutive control signals being in the form of Gray code, said at least one peripheral circuit being operable to carry out said at least one function in respect of said memory in accordance with said control signals; and a bus connecting the control circuitry and said at least one peripheral circuit, said bus being arranged to carry the control signals from the control circuitry to said at least one peripheral circuit.

11. A method for transmitting signals comprising the steps of:

generating consecutive signals used to control a memory device, the signals being in the form of Gray code;

placing the signals on a control bus;

transmitting the signals along the control bus where they are received by the device; and performing one or more functions in respect to the memory device by a peripheral circuit under control of the control signals.

12. A memory device comprising a data storage portion, at least one peripheral circuit connected to said data storage portion for carrying out a function with respect to said data storage portion and control circuitry connected to said at least one peripheral circuit and operable to provide a plurality of consecutive signals for controlling the function of said at least one peripheral circuit, said consecutive signals being generated by said control circuitry in the form of Gray code.

13. A method for carrying out at least one function in respect of a memory of a memory device, said memory device also having at least one peripheral circuit connected to said memory and operable to carry out said at least one function, said method comprising generating a plurality of consecutive control signals, said control signals being generated in the form of Gray code and applying said plurality of consecutive control signals to said at least one peripheral circuit said control signals controlling said at least one peripheral circuit to permit said at least one function to be carried out in respect of said memory.

14. A memory array comprising a plurality of memory cells, peripheral circuitry connected to said cells for controlling said cells, said peripheral circuitry including a plurality of separately operable decoders each arranged to control a respective peripheral circuit of said peripheral circuitry, and a control circuit having an input for receiving operation instructions for the memory array and an output connected to a bus interconnecting said control circuit with each of said decoders, said control circuit being operable to output signals in Gray code.

15. A memory array as claimed in claim 14 wherein each memory array comprises a flash eprom and said peripheral circuits are arranged to provide signal levels to respective memory cells to erase or program said cells.

16. A method of operating a flash eprom memory array comprising operating memory cells by a plurality of peripheral circuits connected to respective groups of memory cells, each peripheral circuit having a respective decoder arranged to selectively operate the peripheral circuit, the method including distributing to each decoder Gray coded control signals on a bus network.

17. A memory, comprising:

A control line operable to carry first and second sequential control signals, each having a plurality of bits and each having a predetermined number of bit values arranged in a predetermined number of bit positions, no more than one bit position in said second holding a different bit value than a corresponding bit position in said first signal;

a data storage section having an input; and a peripheral circuit having an input coupled to said control line and an output coupled to said input of said data storage section and being operable to carry out at least one function in respect to the data storage section.

18. The memory of claim 17 further comprising a control circuit having an output coupled to said control line.

19. The memory of claim 18 wherein said control circuit comprises a state machine.

20. The memory of claim 17 further comprising a decoder interposed between said control line and said peripheral circuit, said decoder having an input coupled to said control line and an output coupled to said input of said peripheral circuit.

21. A memory device comprising:

a memory;

control circuitry operable to provide a plurality of consecutive control signals, said consecutive control signals being in the form of Gray code, said device being operable to carry out, in accordance with the said control signals, at least one function in respect of said memory; and two buses for connecting said memory with said control circuitry, said buses carrying the consecutive control signals, each bus carrying the same consecutive control signals and being driven in opposite directions through the memory device.

22. A memory device comprising a memory and an input for receiving a plurality of consecutive control signals in the form of Gray code, said device being operable to carry out, in accordance with said control signals, at least one function in respect of said memory, the Gray code control signals having at least one dummy code which can be combined with a preceding or successive code to represent a single state so that the maximum number of states which can precede and succeed said single state is greater than the number of bits in the control signal.

23. A memory device comprising:

a memory;

control circuitry operable to provide a plurality of control signals, said consecutive control signals being in the form of Gray code, said device being operable to carry out, in accordance with the said control signals, at least one function in respect of said memory; and a bus connecting the control circuitry and the memory, said bus being arranged to carry the control signals from the control circuitry to said memory.

* * * * *